(12) United States Patent
Su et al.

(10) Patent No.: US 11,074,975 B1
(45) Date of Patent: Jul. 27, 2021

(54) NON-VOLATILE REGISTER AND IMPLEMENTATION OF NON-VOLATILE REGISTER

(71) Applicant: MACRONIX International Co., Ltd., Hsinchu (TW)

(72) Inventors: Chun-Lien Su, Taichung (TW); Ming-Shang Chen, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/841,711

(22) Filed: Apr. 7, 2020

(51) Int. Cl.
| | |
|---|---|
| G11C 11/34 | (2006.01) |
| G11C 16/04 | (2006.01) |
| G11C 16/10 | (2006.01) |
| G11C 16/08 | (2006.01) |
| H01L 27/1157 | (2017.01) |
| H01L 27/11524 | (2017.01) |

(52) U.S. Cl.
CPC .......... G11C 16/0483 (2013.01); G11C 16/08 (2013.01); G11C 16/10 (2013.01); H01L 27/1157 (2013.01); H01L 27/11524 (2013.01)

(58) Field of Classification Search
CPC .... G11V 16/0483; G11V 16/08; G11V 16/10; H01L 27/11524; H01L 27/1157
USPC ........................................ 365/185.17, 185.18
See application file for complete search history.

(56) References Cited

U.S. PATENT DOCUMENTS

| | | | | |
|---|---|---|---|---|
| 8,531,886 B2* | 9/2013 | Huang | ............... | G11C 16/3418 365/185.18 |
| 8,659,944 B2* | 2/2014 | Hung | ............... | G11C 16/10 365/185.17 |
| 8,890,233 B2* | 11/2014 | Hung | ............... | H01L 29/4234 257/324 |
| 8,923,059 B2* | 12/2014 | Joo | ............... | H01L 27/11582 365/185.17 |
| 9,224,474 B2* | 12/2015 | Lue | ............... | G11C 16/10 |
| 9,305,653 B1* | 4/2016 | Hsieh | ............... | G11C 16/10 |
| 9,344,465 B2* | 5/2016 | Stern | ............... | H04L 41/0613 |
| 9,349,465 B2* | 5/2016 | Jang | ............... | G11C 16/3427 |
| 9,679,660 B1* | 6/2017 | Bae | ............... | G11C 16/08 |
| 10,276,250 B1* | 4/2019 | Chen | ............... | G11C 16/105 |
| 10,304,541 B2* | 5/2019 | Hwang | ............... | G11C 16/10 |
| 10,741,262 B2* | 8/2020 | Lin | ............... | G11C 11/5628 |
| 2017/0178736 A1* | 6/2017 | Yang | ............... | G11C 11/5628 |
| 2017/0330631 A1* | 11/2017 | Diep | ............... | G11C 7/14 |
| 2020/0308335 A1* | 10/2020 | Praw | ............... | C08G 18/7671 |

* cited by examiner

Primary Examiner — Viet Q Nguyen
(74) Attorney, Agent, or Firm — J.C. Patents

(57) ABSTRACT

A non-volatile register is provided. The non-volatile register includes a plurality of cell strings with respect to a plurality of bit lines, wherein each cell string includes a plurality of cells. Each word line is respectively connecting to a gate of one cell for each cell string to correspondingly form a page. The pages are configured into: a central page used as a register to store registered data; and a plurality of dummy pages at both sides of the central page. The dummy pages are controlled to provide a boosted channel voltage to a portion of memory cells of the central page, not being programmed. A source selection transistor is connected to a first side for each cell string. A drain selection transistor is connected to a second side for each cell string.

20 Claims, 5 Drawing Sheets

NON-VOLATILE REGISTER AND IMPLEMENTATION OF NON-VOLATILE REGISTER

BACKGROUND

Technical Field

The invention is related to memory device and particularly related to non-volatile register based on the structure of NAND flash memory.

Description of Related Art

Non-volatile memory device has been a very popular electronic product, used to store a large amount of data. The non-volatile memory device may be fabricated in various types, in which NAND flash memory is one of the various non-volatile memory devices.

The basic structure of the NAND flash memory includes a cell string formed from a plurality of cells in series connection. One cell string is controlled by one bit line. Each cell in the cell string is controlled by one word line. In operation, the cell string is turned on or selected by a voltage level at the bit line. A larger number of cell strings correspond to the bit lines are usually involved, relating to the page size. As usual implementation, each word line connects one cell for each cell string to form one page, in which the page size such as 1024 bits is determined by the number of bit lines.

The NAND flash memory is good for storing a large amount of data. In operation of NAND flash memory, all cells are turned on in each cell string when programming, in which a certain number of cells in the pages may have already stored data. This kind of operation may cause disturbance for the cells not currently selected for programming. The data already stored in some cells of the same page may be disturbed. After several times of programing operations on the same page, the date already stored may be changed, causing error.

In the operation features of NAND flash memory, the NAND flash memory is basically not expected to use as a register, which is used to temporarily store a small amount of data in each time but programmed frequently. If the number of partial programming on the same page is over a limited number, the data stored in the page would get error.

SUMMARY

The invention has proposed a register, which may be based on the structure of NAND memory. The register may be easily incorporated into the circuit of electronic product.

In an embodiment, the invention provides a non-volatile register. The non-volatile register includes a plurality of cell strings with respect to a plurality of bit lines, wherein each cell string includes a plurality of cells. Each word line is respectively connecting to a gate of one cell for each cell string to correspondingly form a page. The pages are configured into: a central page used as a register to store registered data; and a plurality of dummy pages at both sides of the central page. The dummy pages are controlled to provide a boosted channel voltage to a portion of memory cells of the central page, not being programmed. Further, the applied voltage on the dummy pages can even higher than the applied voltage on the central page. A source selection transistor is connected to a first side for each cell string. A drain selection transistor is connected to a second side for each cell string.

In an embodiment, the invention further provides a non-volatile register. The non-volatile register includes a plurality of cell strings with respect to a plurality of bit lines, wherein each cell string comprises a plurality of cells. Each word line is respectively connecting to a gate of one cell for each cell string to correspondingly form a page. A source selection transistor is connected to a first side for each cell string. A drain selection transistor is connected to a second side for each cell string. The cell strings are divided into an odd cell string set and an even string set. The odd cell string set is used to store a registered data in each programming operation while the even string set is constantly set to a programming inhibited state. Or, the even cell string set is used to store the registered data in the programming operation while the odd string set is constantly set to the programming inhibited state.

In an embodiment, the invention further provides an implementation of non-volatile register. The implementation of non-volatile register includes configuring a plurality of cell strings with respect to a plurality of bit lines, wherein each cell string comprises a plurality of cells. Further, a plurality of word lines is configured for each word line respectively connecting to a gate of one cell for each cell string to correspondingly form a page. The pages are configured into a central page, used as a register to store registered data; and a plurality of dummy page, at both sides of the central page. The dummy pages are controlled to provide a boosted channel voltage to a portion of memory cells of the central page, not being programmed. Further, the applied voltage on the dummy pages can even higher than the applied voltage on the central page. A source selection transistor is configured to connect to a first side for each cell string. A drain selection transistor is configured to connect to a second side for each cell string.

In an embodiment, the invention further provides an implementation of non-volatile register. The implementation of non-volatile register includes configuring a plurality of cell strings with respect to a plurality of bit lines, wherein each cell string comprises a plurality of cells. Further, a plurality of word lines is configured for each word line respectively connecting to a gate of one cell for each cell string to correspondingly form a page. A source selection transistor is configured to connect to a first side for each cell string. A drain selection transistor is configured to connect to a second side for each cell string. The cell strings are divided into an odd cell string set and an even string set. The odd cell string set is used to store a registered data in each programming operation while the even string set is constantly set to a programming inhibited state. Or, the even cell string set is used to store the registered data in the programming operation while the odd string set is constantly set to the programming inhibited state.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

The invention has proposed a non-volatile register, which is based on the structure of NAND flash memory with modified operation. The non-volatile register may be fabricated by the fabrication process for the NAND flash memory in reduced size, such as just one page, so to be used as a register for storing a small amount of data. However, the implementation of non-volatile register would increase the number of partial programming on the same page, which keeps the property in use of a register.

Multiple embodiments are provided for looking into the mechanism for converting the usual NAND flash memory into non-volatile register. Then, a non-volatile register in embodiments is also provided. A combination between the embodiments may be made.

Figure 1:
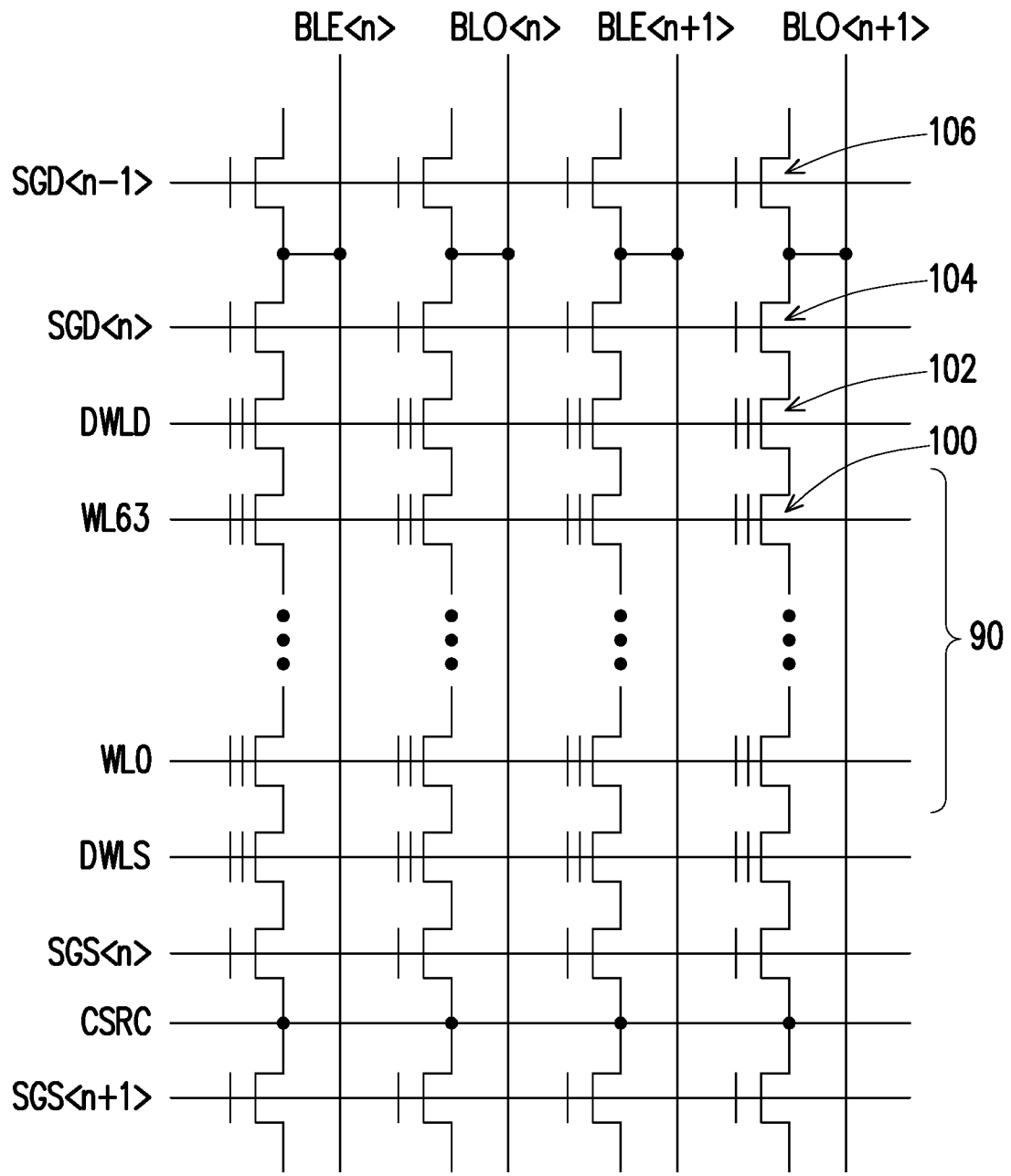
FIG. 1 is a drawing, schematically illustrating a circuit of NAND flash memory as looked into in the invention.

The invention has looked into the operation of the usual NAND flash memory, so as realize the mechanism to converting the mechanism of NAND flash memory into register. FIG. 1 is a drawing, schematically illustrating a circuit of NAND flash memory as looked into in the invention.

Referring to FIG. 1, a NAND flash memory may include a large number of bit lines, as indicated by BLE and BLO, in which the bit lines may be arranged into even bit lines BLE and odd bit lines BLO. The index n is the series number of the bit lines. The example in FIG. 1 is taking four bit lines for description. The actual number of bit lines may correspond to a page size of 1024 bits or even more. The number of word lines in the example is 64, indicated by WL0 to WL63. But in some embodiment, the number of word lines may be less or larger. The cell string 90 the has 64 cells connected in series. Each word line connected to one cell 100 of the cell string 90 corresponding to each bit line and then defines one page of data. Two protection cells 102, as controlled by DWLD line and DWLS line may be implemented at the drain side and the source side of the cell string 90, according to the usual manner.

Further the selection transistors 104 are also implemented at the drain side and the source side of each cell string 90. The gate of the selection transistors 104 at the source side is controlled by the SGS<n> line for this n block. The gate of the selection transistors 104 at the drain side is controlled by the SGN<n> line for this n block, which is connected with the n-block and the n+1 block.

Figure 2:
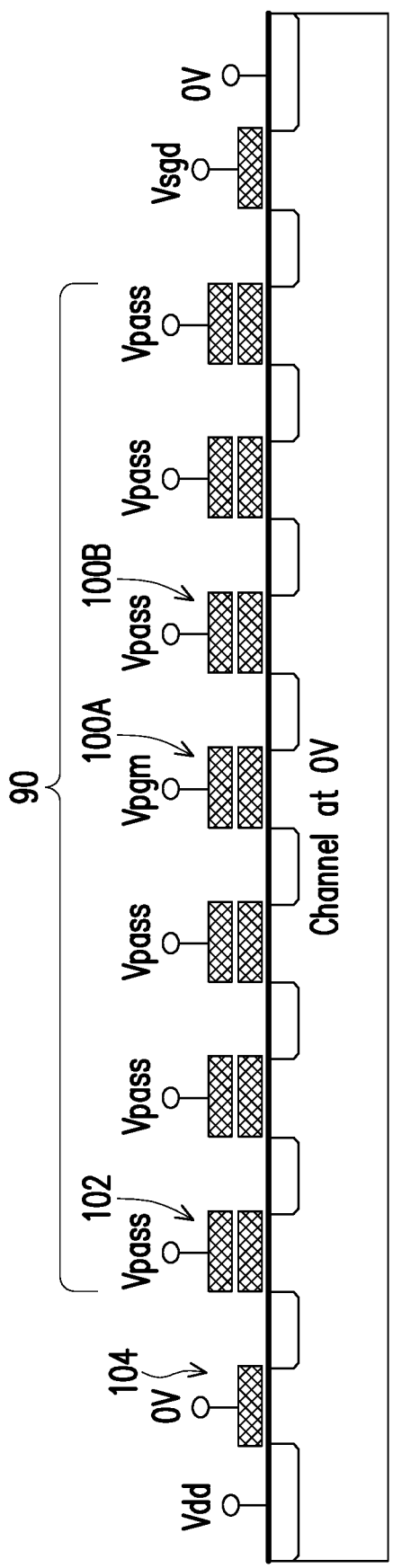
FIG. 2 is a drawing, schematically illustrating a semiconductor structure of NAND flash memory at a condition of programming, as looked into in the invention.

As noted, the NAND flash memory is not modified into non-volatile register yet. Before proposing the non-volatile register, the programming mechanism is further looked into. FIG. 2 is a drawing, schematically illustrating a semiconductor structure of NAND flash memory at a condition of programming, as looked into in the invention.

Referring to FIG. 2, in the programing operation, one cell string 90 is selected by applying a 0V at the bit line, and a channel voltage of 0V is passed to the cell 100A to be programmed. The gate of the cell 100A to be programmed is applied by a programming voltage Vpgm through the corresponding word line. To pass the channel voltage to the cell 100A, the other word lines WL are by applied the pass voltage Vpass, which is then applied to the gates of the other cells 100 in the cell string 90. The pass voltage Vpass is less than the programming voltage Vpgm, so as to conduct the cells but not to program the cells. It can be noted that the programming voltage Vpgm is applied to the cells of the page, defined by this word line. However, the bit line determines the cell in this page is programmed. In other words, the non-programmed cell strings controlled by the bit line is set to floating, so as to inhibit the programming operation.

Figure 3:
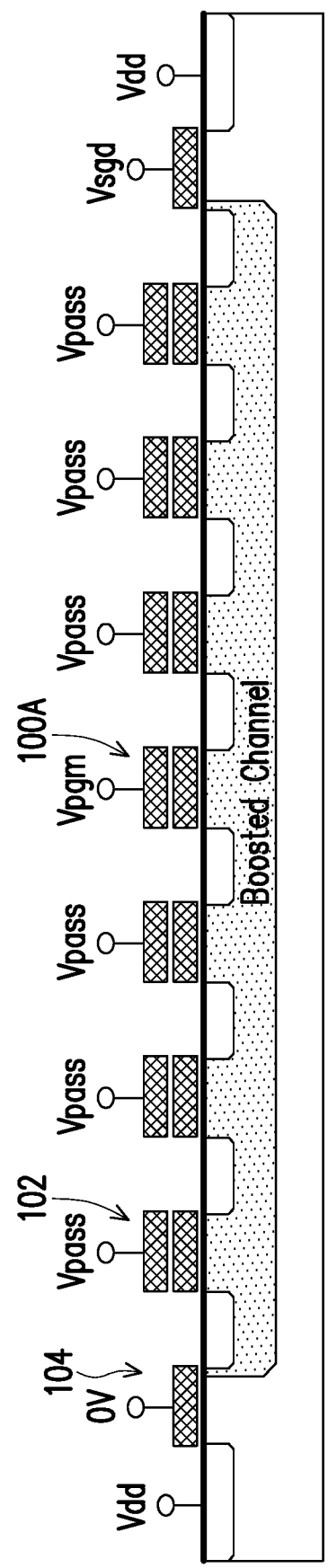
FIG. 3 is a drawing, schematically illustrating a semiconductor structure of NAND flash memory at a condition of programming inhibited, as looked into in the invention.

FIG. 3 is a drawing, schematically illustrating a semiconductor structure of NAND flash memory at a condition of programming inhibited, as looked into in the invention. Referring to FIG. 3, for the cell string not to be programmed, the cells of this cell string also receive the word line voltages of Vpgm and Vpass. However, the channel of this cell string is floating as controlled by the bit line with a voltage Vdd. Then. The channel voltage is self-boosted by the voltages of Vpgm and Vpass as a whole effect, which is approaching to the programming voltage of Vpgm. The boosted channel voltage is a total effect from all cells 100 in the cell string 90 according to the equivalent circuit. Then, the voltage different between the programming voltages of Vpgm and the channel voltage is ideally kept to a level, not sufficient to program the cell under the Vpgm of the cell 100A in the same page.

As noted, if the voltage Vpass is not sufficient high, the cells 100 not to be programmed has a probability to be programmed as unexpected. This is so called disturbance. In the normal operation of the NAND operation, one full page corresponding to one word line with Vpgm is programmed. The cells not to be programmed in one page basically just suffers once of disturbance, and then it is still at the safe level.

However, if one programming operation is just programming a portion of the page, also referred as a partial programming in other words such as only programming one or two bytes of the page in each programming operation, the other cells not programmed would suffer multiple time of disturbances and may unexpected programmed. This manner is not suitable in use for register, based n the convention NAND operation.

Figure 4:
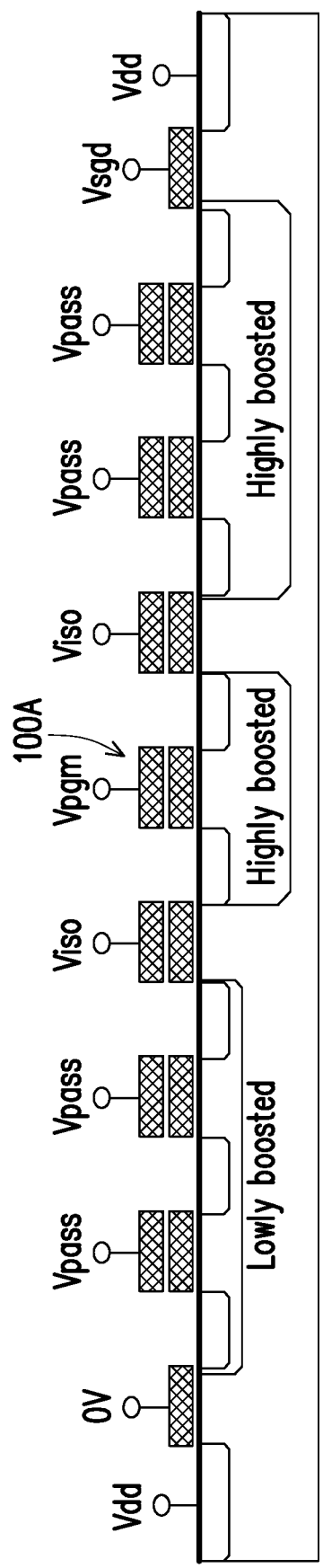
FIG. 4 is a drawing, schematically illustrating a semiconductor structure of NAND flash memory at a condition of local self-boosting, as looked into in the invention.

FIG. 4 is a drawing, schematically illustrating a semiconductor structure of NAND flash memory at a condition of local self-boosting, as looked into in the invention. Referring to FIG. 4, some modification on the way to apply the pass voltage Vpass on the non-programmed cells may be used. In this example, the adjacent cells of the programmed cell 100A may be applied isolation voltage Viso on the gates, so to be highly boosted at the channel. This is also realized as a local self-boosting mechanism. This way may allow the cells at the drain side has highly boosted voltage at channel while the cells at the source side may have lowly boosted voltage at channel.

Figure 5:
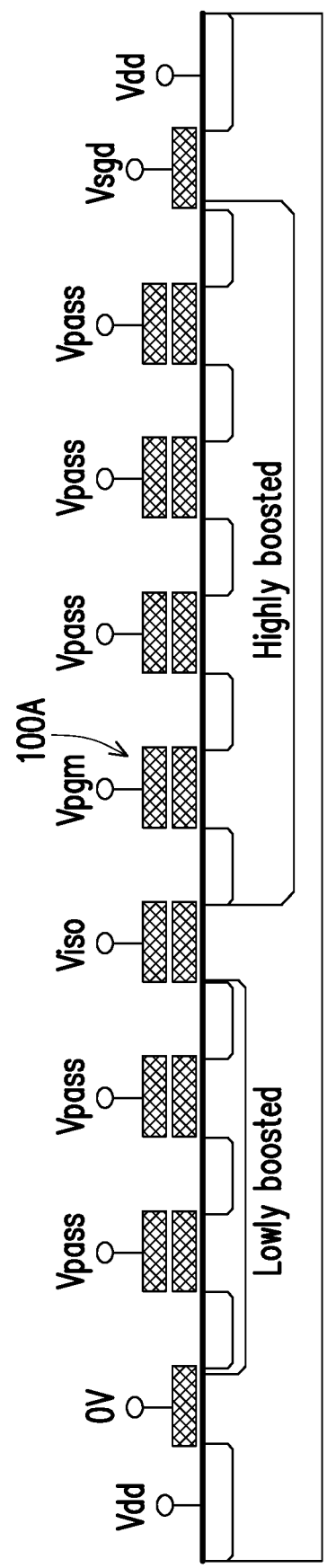
FIG. 5 is a drawing, schematically illustrating a semiconductor structure of NAND flash memory at a condition of erase area self-boosting, as looked into in the invention.

FIG. 5 is a drawing, schematically illustrating a semiconductor structure of NAND flash memory at a condition of erase area self-boosting, as looked into in the invention. Referring to FIG. 5, only the source side of the programmed cell 100A is applied by the isolation voltage Viso at the gate. In this situation, the channel has two regions of highly boosted region and the lowly boosted.

The invention is to taking the structure of NAND memory with modifications in implementation, so as to be used as a non-volatile register. As previously stated, the operation of register is relatively small amount of data in each programming operation but the programming operation is frequently performed. In other words, the not-programed cells would suffer multiple times of disturbance. The invention may reduce the disturbance effect in each time of programming. The page in register of the invention may endure more times of disturbance, so that the invention may increase the number of partial programming. The NAND page may be used as a register.

Figure 6:
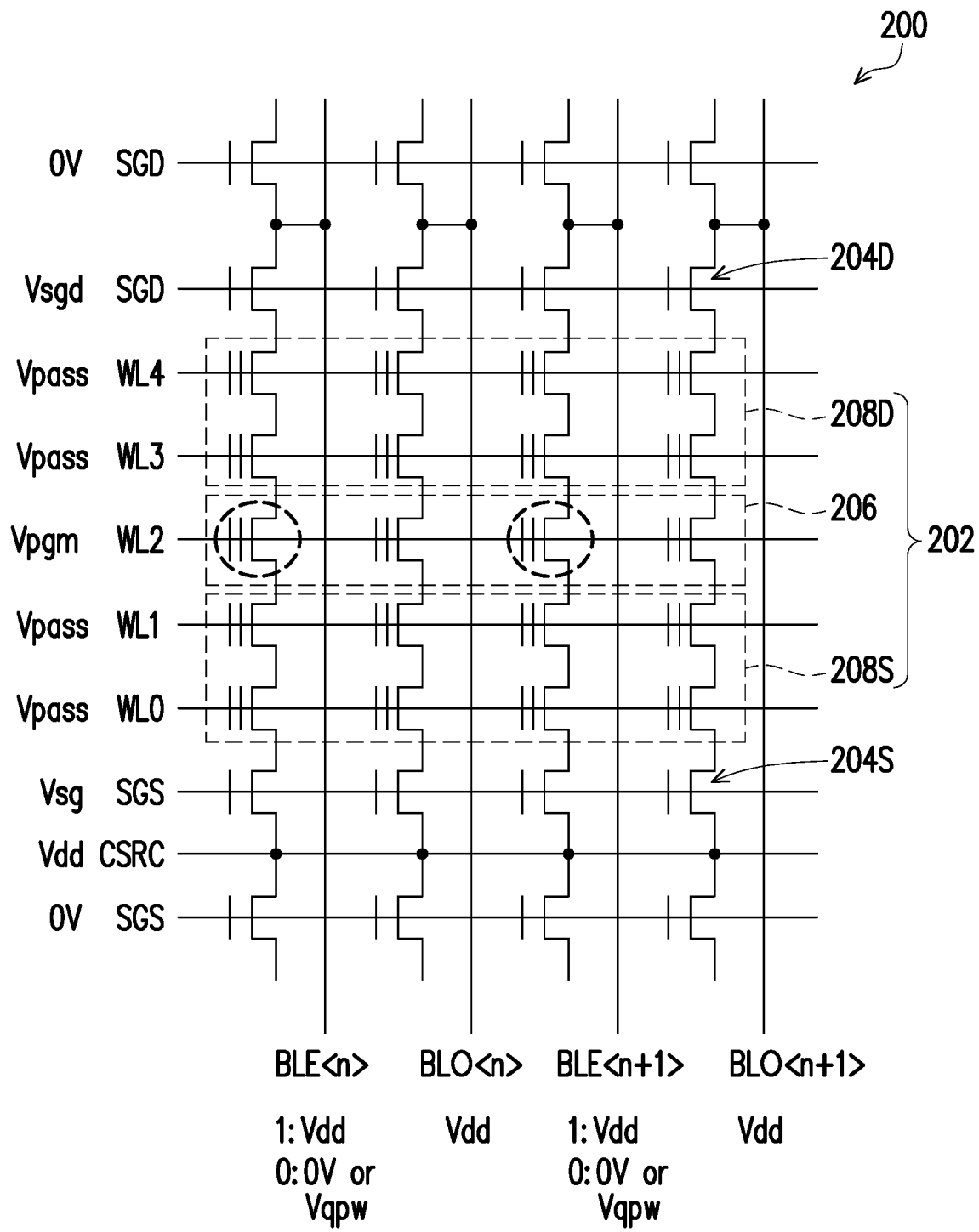
FIG. 6 is a drawing, schematically illustrating a circuit of non-volatile register, according to an embodiment of the invention.

FIG. 6 is a drawing, schematically illustrating a circuit of non-volatile register, according to an embodiment of the invention. Referring to FIG. 6, in an embodiment, a non-volatile register 200 is provided. The non-volatile register includes a plurality of cell strings 202 with respect to a plurality of bit lines BLE, BLO. The number of bit lines is relatively a large number at least equal to the page size, such as 1024 bits or more. However, the invention is not just limited to a specific number. Each cell string 202 includes a plurality of cells with respect to the pages 206, 208S, 208D. The number of the cells in the cell string 200 is relatively small. In an embodiment, the number the cells in the cell string 200 is seven or less, such as 7, 5 and 3. In an embodiment, the number the cells in the cell string 200 is five in FIG. 6 as an example for description. In an embodiment, the number the cells in the cell string 200 is odd number. Based on the NAND structure, a plurality of word lines, WL0 to WL4, equal to the number of the cells in the cell string 202 is implemented. Each word line respectively connects to a gate of one cell for each cell string 202 to correspondingly form a page. However, in an embodiment, the five pages with respect to the word lines are configured into have a central page 206, which is used as a register to store registered data. A plurality of dummy pages 208S, 208D are arranged at both sides of the central page 206.

The dummy pages 208S, 208D are controlled to provide a boosted channel voltage to a portion of cells of the central page 206, not being programmed. As a result, the cells of the central page 206 has more capability to resist the disturbance when the central page 206 is used as register suffering frequently programming operation.

In addition, to have the control mechanism to select the cell string, a source selection transistor 204S is connected to a first side for each cell string 202. A drain selection transistor 204D is connected to a second side for each cell string 202. The gate of the source selection transistor 204S is control by the gate selection line, SGS. The source of the source selection transistor 204S is connected to the common source line, CSRC. The gate of the drain selection transistor 204D is connected to the gate selection line, SGD. The source of the drain selection transistor 204D is respectively connected to bit line. The bit line voltage provides the low voltage level, such as 0V or Vqpw, when programming the cell or a voltage Vdd, such as 1V, to turn off the drain selection transistor 204D, so as to cause the self-boosting to the channel for the cell not programmed.

Ideally, there is no need of the dummy pages 208S, 208D if the fabrication condition can be well controlled to form the central page 206. In consideration of the symmetric condition for the cells of the central page 206, the dummy pages 208S, 208D are involved to assure that the access operation is properly performed. Each dummy page 208S, 208D may include one dummy page or two dummy page or even more. The embodiment is provided for descriptions but the invention is not limited thereto.

In this implementation, the dummy page is not actually used to store data, so that the Vpass may be set to high, to bring up the boosted channel voltage in the central page 206, which is actually used to store the registered data in use as a non-volatile register 200. The disturbance effect may be reduced. The applied voltage on the dummy pages can even higher than the applied voltage on the central page.

In further implementation as an example, the cell strings 202 may be divided into an odd cell string set, indicated by BLO and an even string set indicated by BLE. Then, to avoid a leak between adjacent cells of the central page 206, in an embodiment, the odd cell string set BLO<n> is used to store the registered data while the even string set BLE<n> is constantly set to a programming inhibited state. In an embodiment, the even cell string set BLE<n> may be used to store the registered data while the odd string set BLO<n> is constantly set to the programming inhibited state. Since the number of bit lines is a large number, the page size is still far enough to store the registered data when the page size is cut in half. In an example, the register data of one byte of yyyyyyyy is to be written to the central page 206, data in the page may be in a form of 1y1y1y1y1y1y1y1y, as an example. The bits of "1" are kept not being programmed. The cell indicated by dashed rounds are the cells to actually store data.

In an embodiment, a portion of the central page 206 may be additionally used to store error correction information. In an example, the registered date may be written twice or more in each programming operation, so as to assure the correction of the registered data as stored.

As a result, the number of partial programming on the central page 206, or called the register page, may be raised. This page is suitable for use as a register.

Figure 7:
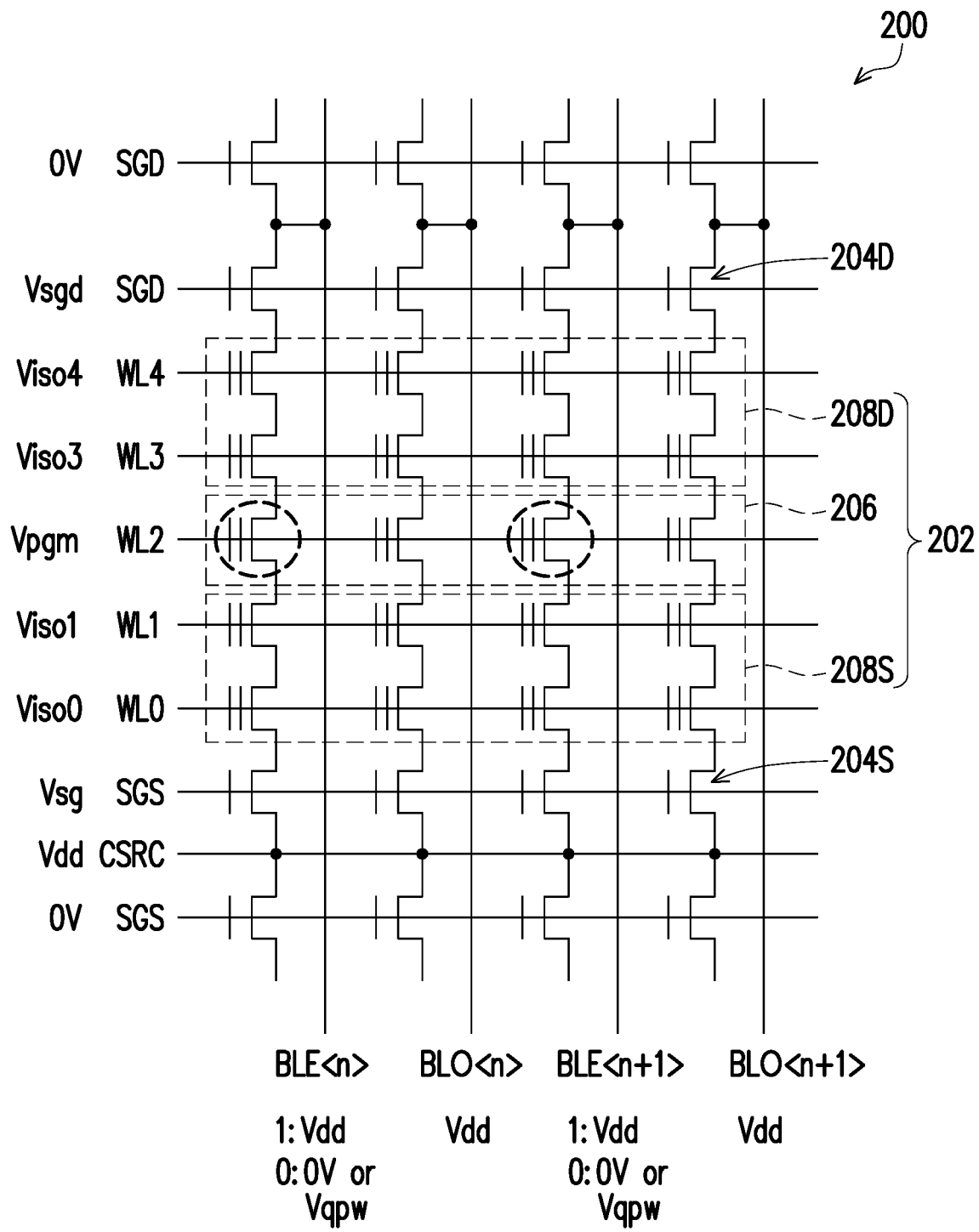
FIG. 7 is a drawing, schematically illustrating a circuit of non-volatile register, according to an embodiment of the invention.

In further modification the pass voltage Vpass may be modified. FIG. 7 is a drawing, schematically illustrating a circuit of non-volatile register, according to an embodiment of the invention.

Referring to FIG. 7, the isolation voltage Viso may be taken to replace the pass voltage Vpass. The dummy page 208S at the source side may be applied by isolation voltage Viso® and isolation voltage Viso1. The dummy page 208D at the drain side may be applied by isolation voltage Viso3 and isolation voltage Viso4. The page connected by the word line WL2 is the central page 206, serving as the registering function, and is applied by the programming voltage Vpgm. In an embodiment, the relation of the various voltages may be Vpgm>Viso4=Viso3=Vpass>Viso1>Viso0. However, the invention is not just limited to the embodiment.

Furthermore, even if without specific arrangement to the word lines of the cell string, the bit line arrangement itself about cutting in half is still have the capability to reduce the leakage between the adjacent cells of the same page.

In an embodiment, the invention further provides a non-volatile register. The non-volatile register includes a plurality of cell strings with respect to a plurality of bit lines, wherein each cell string comprises a plurality of cells. Each word line is respectively connecting to a gate of one cell for each cell string to correspondingly form a page. A source selection transistor is connected to a first side for each cell string. A drain selection transistor is connected to a second side for each cell string. The cell strings are divided into an odd cell string set and an even string set. The odd cell string set in an embodiment may be used to store a registered data in each programming operation while the even string set is constantly set to a programming inhibited state. Or, the even cell string set is used to store the registered data in the programming operation while the odd string set is constantly set to the programming inhibited state.

As to the foregoing descriptions, the non-volatile register as provided in the invention is based on the NAND structure. The non-volatile register may be fabricated by the process compatible with the fabrication process for the NAND flash memory. The number of partial programming in the register page is effectively increased to be suitable for use as a register.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A non-volatile register, comprising:
   a plurality of cell strings with respect to a plurality of bit lines, wherein each cell string comprises a plurality of cells;
   a plurality of word lines, each word line respectively connecting to a gate of one cell for each cell string to correspondingly form a page, wherein the pages are configured into:
      a central page, used as a register to store registered data; and
      a plurality of dummy pages, at both sides of the central page, wherein the dummy pages are controlled to provide a boosted channel voltage to a portion of memory cells of the central page, not being programmed;
   a source selection transistor, connected to a first side for each cell string; and
   a drain selection transistor, connected to a second side for each cell string,
   wherein the central page stores the registered data and an error correction information of the registered data.

2. The non-volatile register as recited in claim 1, wherein the cell strings are divided into an odd cell string set and an even string set, wherein the odd cell string set is used to store the registered data while the even string set is constantly set to a programming inhibited state or the even cell string set is used to store the registered data while the odd string set is constantly set to the programming inhibited state.

3. The non-volatile register as recited in claim 1, wherein a number of the word lines is three, five, or seven.

4. The non-volatile register as recited in claim 1, wherein the central page stores a plurality sets of the registered data.

5. The non-volatile register as recited in claim 4, wherein each set of the registered data is stored in each programming operation.

6. The non-volatile register as recited in claim 1, wherein a number of the word lines is less than or equal to seven while a number of the bit lines is corresponding to a data size with respect to at least a page size.

7. The non-volatile register as recited in claim 1, wherein a voltage applied to dummy word lines of the dummy pages is higher than a voltage applied to a center word line of the central page for a programming operation.

8. A non-volatile register, comprising:
   a plurality of cell strings with respect to a plurality of bit lines, wherein each cell string comprises a plurality of cells;
   a plurality of word lines, each word line respectively connecting to a gate of one cell for each cell string to correspondingly form a page;
   a source selection transistor, connected to a first side for each cell string; and
   a drain selection transistor, connected to a second side for each cell string,
   wherein the cell strings are divided into an odd cell string set and an even string set, wherein the odd cell string set is used to store a registered data in each programming operation while the even string set is constantly set to a programming inhibited state or the even cell string set is used to store the registered data in the programming operation while the odd string set is constantly set to the programming inhibited state.

9. The non-volatile register as recited in claim 8, wherein a number of the word lines is less than or equal to seven while a number of the bit lines is corresponding to a data size with respect to at least a page size.

10. The non-volatile register as recited in claim 8, wherein one of the page is used as a register page.

11. An implementation of non-volatile register, comprising:
    configuring a plurality of cell strings with respect to a plurality of bit lines, wherein each cell string comprises a plurality of cells;
    configuring a plurality of word lines, each word line respectively connecting to a gate of one cell for each cell string to correspondingly form a page, wherein the pages are configured into:
       a central page, used as a register to store registered data; and
       a plurality of dummy pages, at both sides of the central page, wherein the dummy pages are controlled to provide a boosted channel voltage to a portion of memory cells of the central page, not being programmed;
    configuring a source selection transistor, connected to a first side for each cell string; and
    configuring a drain selection transistor, connected to a second side for each cell string,
    wherein the central page is configured to store the registered data and an error correction information of the registered data.

12. The implementation of non-volatile register as recited in claim 11, wherein the cell strings are divided into an odd cell string set and an even string set, wherein the odd cell string set is used to store the registered data while the even string set is constantly set to a programming inhibited state or the even cell string set is used to store the registered data while the odd string set is constantly set to the programming inhibited state.

13. The implementation of non-volatile register as recited in claim 11, wherein a number of the word lines is three, five, or seven.

14. The implementation of non-volatile register as recited in claim 11, wherein the central page is configured to store a plurality sets of the registered data.

15. The implementation of non-volatile register as recited in claim 14, wherein each set of the registered data is stored in each programming operation.

16. The implementation of non-volatile register as recited in claim 11, wherein a number of the word lines is less than or equal to seven while a number of the bit lines is corresponding to a data size with respect to at least a page size.

17. The implementation of non-volatile register as recited in claim 11, wherein a voltage applied to dummy word lines of the dummy pages is higher than a voltage applied to a center word line of the central page for a programming operation.

18. An implementation of non-volatile register, comprising:
   configuring a plurality of cell strings with respect to a plurality of bit lines, wherein each cell string comprises a plurality of cells;
   configuring a plurality of word lines, each word line respectively connecting to a gate of one cell for each cell string to correspondingly form a page;
   configuring a source selection transistor, connected to a first side for each cell string; and
   configuring a drain selection transistor, connected to a second side for each cell string,
   wherein the cell strings are divided into an odd cell string set and an even string set, wherein the odd cell string set is used to store a registered data in each programming operation while the even string set is constantly set to a programming inhibited state or the even cell string set is used to store the registered data in the programming operation while the odd string set is constantly set to the programming inhibited state.

19. The implementation of non-volatile register as recited in claim 18, wherein a number of the word lines is less than or equal to seven while a number of the bit lines is corresponding to a data size with respect to at least a page size.

20. The implementation of non-volatile register as recited in claim 18, wherein one of the page is used as a register page.

* * * * *